United States Patent
Weiss et al.

(10) Patent No.: US 7,826,985 B2
(45) Date of Patent: Nov. 2, 2010

(54) POWER MODULE LIFE ESTIMATION FATIGUE FUNCTION

(75) Inventors: Bruce W. Weiss, Milwaukee, WI (US); Lixiang Wei, Whitefish Bay, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 357 days.

(21) Appl. No.: 12/114,569

(22) Filed: May 2, 2008

(65) Prior Publication Data
US 2009/0276165 A1   Nov. 5, 2009

(51) Int. Cl.
*G01L 1/00* (2006.01)
(52) U.S. Cl. .......................................................... 702/42
(58) Field of Classification Search .................. 702/33, 702/35, 41, 42
See application file for complete search history.

(56) References Cited

U.S. PATENT DOCUMENTS 6,634,236 B2 * 10/2003 Mars ............................ 73/799
2005/0071090 A1    3/2005 Katou

OTHER PUBLICATIONS

M. Held, et al.; "Fast Power Cycling Test for IBGT Modules in Traction Application"; IEEE (1997), 6 pgs.

* cited by examiner

*Primary Examiner*—Drew A Dunn
*Assistant Examiner*—Stephen J Cherry
(74) *Attorney, Agent, or Firm*—Fletcher Yoder LLP; Alexander R. Kuszewski; John M. Miller (57) ABSTRACT

A system and method for estimating a condition of a power module is provided. In accordance with an embodiment, a motor controller may be maintained by tracking a total proportion of power module life expended by a power module in a variable frequency motor controller based on a minimum junction temperature or a mean junction temperature and a junction temperature change, and indicating when the power module is estimated to fail.

18 Claims, 10 Drawing Sheets

$T_m$ AT 30K ABOVE AMBIENT TEMPERATURE $T_m$ AT BASE AMBIENT TEMPERATURE

POWER MODULE LIFE ESTIMATION FATIGUE FUNCTION

BACKGROUND

The invention relates generally to the field of electrical power converters and inverters. More particularly, the invention relates to techniques for predicting the life cycle of power modules, such as those used in motor drives.

Power inverters and converters employ power modules to produce a desired power waveform to power various devices, such as motors and other equipment. Power modules generally include power semiconductor switches such as insulated gate bipolar transistors (IGBTs) that are caused to cycle rapidly on and off to produce a desired power waveform. After a period of use, however, power modules tend to fail.

A predominant cause of power module failure arises from power cycling, which may cause connections to fatigue and fail. Moreover, thermal cycling of the type employed by inverters may initiate wire crack growth at aluminum wire wedge bonds and similar contact points, generally occurring at connections to aluminized silicon on the IGBTs. Strain and fatigue introduced by a mismatch of the coefficient of thermal expansion (CTE) of module materials tends to cause wire crack growth. New cracks may generally be caused by thermal cycling, leading to fatigue of the bonds of materials of the assembly.

Power modules tend to fail in a predictable manner under constant operating conditions, such as constant maximum junction temperature and median junction temperatures. As a result, manufacturers of power modules may provide cycle life rating data at particular operating conditions. For example, a manufacturer may provide various cycle life rating data at certain maximum junction temperatures ($T_{jMax}$), junction temperature change ($\Delta T_j$), and mean junction temperatures ($T_m$). The mean junction temperature may be defined as the junction temperature averaged over time or averaged based upon the maximum and minimum junction temperature.

While power module life cycle data may offer predictability under constant operating conditions, many power module applications, such as inverter drives, tend to operate under variable conditions. Algorithms have been developed to estimate cycle life, but the algorithms generally assume constant junction temperature change ($\Delta T_j$) and constant mean junction temperatures ($T_m$). Moreover, though strain energy has been applied in models estimating solder joint reliability, such models do not apply directly to bond wire joints and further fail to account for variable operating conditions such as variable junction temperature ($T_j$) and variable mean junction temperature ($T_m$).

BRIEF DESCRIPTION

The invention provides systems and methods for estimating a condition of a power module. In accordance with an aspect of the invention, a motor controller may be maintained by tracking a total proportion of power module life expended by a power module in a variable frequency motor controller based on a minimum junction temperature or a mean junction temperature and a junction temperature change, and indicating when the power module is estimated to fail.

In accordance with another aspect of the invention, a condition of a power module may be estimated by determining a total strain energy per unit volume accumulated over a predetermined number of cycles to failure at a plurality of mean junction temperatures and junction temperature changes, and estimating when the power module will fail based on strain energy per unit volume accumulated by the power module each cycle at a plurality of mean junction temperatures and junction temperature changes.

In accordance with another aspect of the invention, a motor control system may include an inverter module having a power module, the inverter module being configured to provide power to a motor, control circuitry configured to control the inverter module, junction temperature change determination circuitry configured to determine a junction temperature change associated with at least one solid state switch assembly of the power module, mean junction temperature determination circuitry configured to determine a mean junction temperature associated with the at least one solid state switch assembly of the power module, strain energy per unit volume accumulation determination circuitry configured to determine a total amount of strain energy per unit volume accumulated by the at least one solid state switch assembly of the power module each cycle, and power module fatigue determination circuitry configured to determine a fraction of power module life expended each cycle based on the total amount of strain energy per unit volume accumulated by the at least one solid state switch assembly of the power module each cycle and the junction temperature change associated with the at least one solid state switch assembly of the power module and the mean junction temperature associated with the at least one solid state switch assembly of the power module. The motor control system may include power module failure estimation circuitry configured to estimate when the at least one solid state switch assembly of the power module will fail based on a summation of each fraction of power module life expended each cycle, such that the at least one solid state switch assembly of the power module will be estimated to fail when the summation approaches one, and may include diagnostic circuitry configured to provide an estimated remaining power module life based on the summation of each fraction of power module life expended each cycle.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
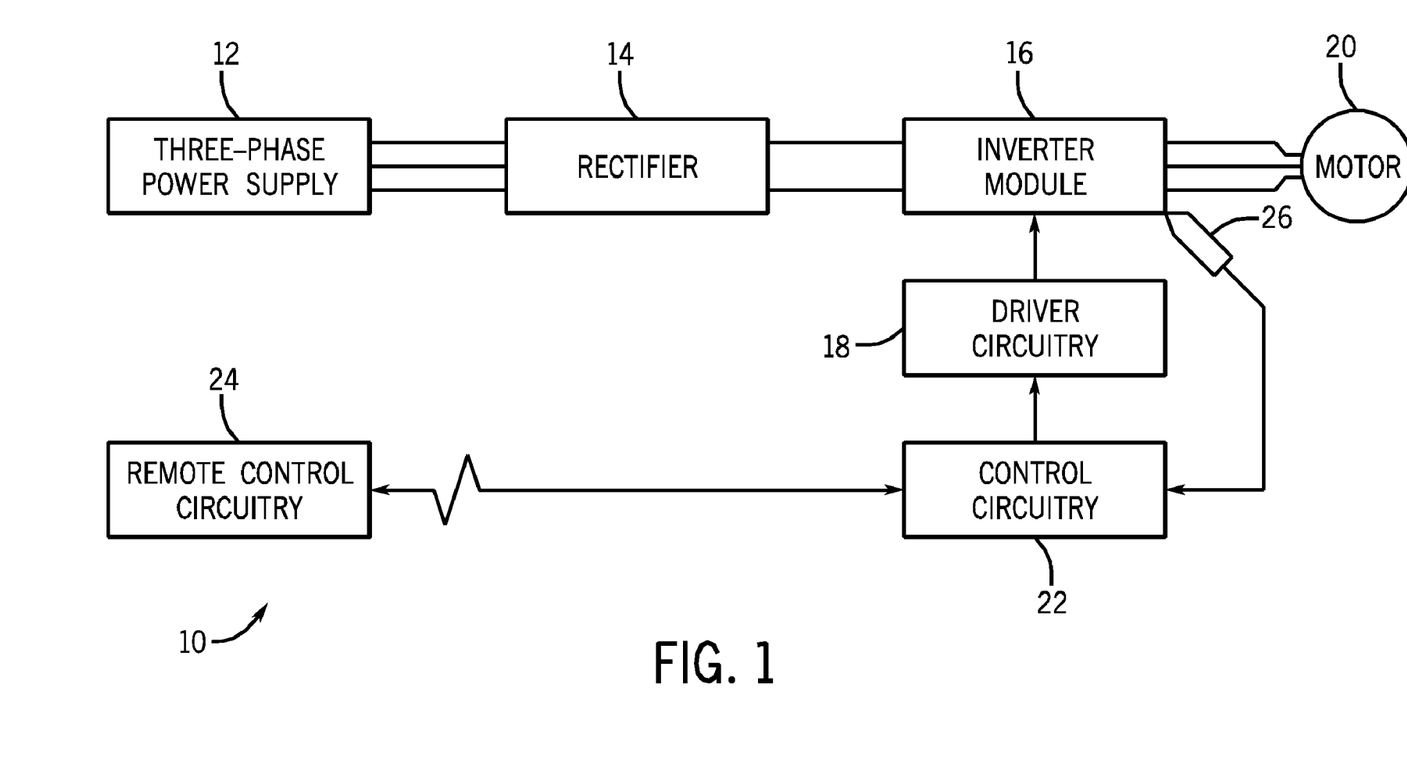
FIG. 1 is a block diagram of a motor drive system employing circuitry for estimating power module cycle life under variable operating conditions, in accordance with an embodiment of the present invention.

FIG. 1 illustrates an exemplary motor control system 10 having power module end-of-life prediction circuitry. A three-phase power supply 12 provides a three-phase voltage waveform at a constant frequency to a rectifier 18, and may be derived from a generator or from an external power grid. Rectifier 14 performs full wave rectification of the three phase voltage waveform, outputting a direct current (DC) voltage difference to an inverter module 16. It should be noted that the present invention may be used with three-phase input, common bus input, and regenerative applications.

Inverter module 16 accepts the positive and negative lines of DC voltage from the rectifier circuitry 14 and outputs a discretized three phase waveform at a desired frequency, independent of the frequency of three-phase power supply 12. Driver circuitry 18 provides inverter module 16 with appropriate signals, enabling inverter module 16 to output the waveform. The resulting three-phase waveform may thereafter drive a load, such as a motor 20.

Control circuitry 22 may receive commands from remote control circuitry 24, using such commands to enable driver circuitry 18 to properly control inverter module 16. With feedback data from sensors 26, control circuitry 22 may keep detailed track of the various conditions under which inverter module 16 may be operating. The feedback data further allow control circuitry 22 to predict when inverter module 16 may likely fail due to thermal cycling, allowing operators to prepare with preventive maintenance or appropriate planning.

Figure 2:
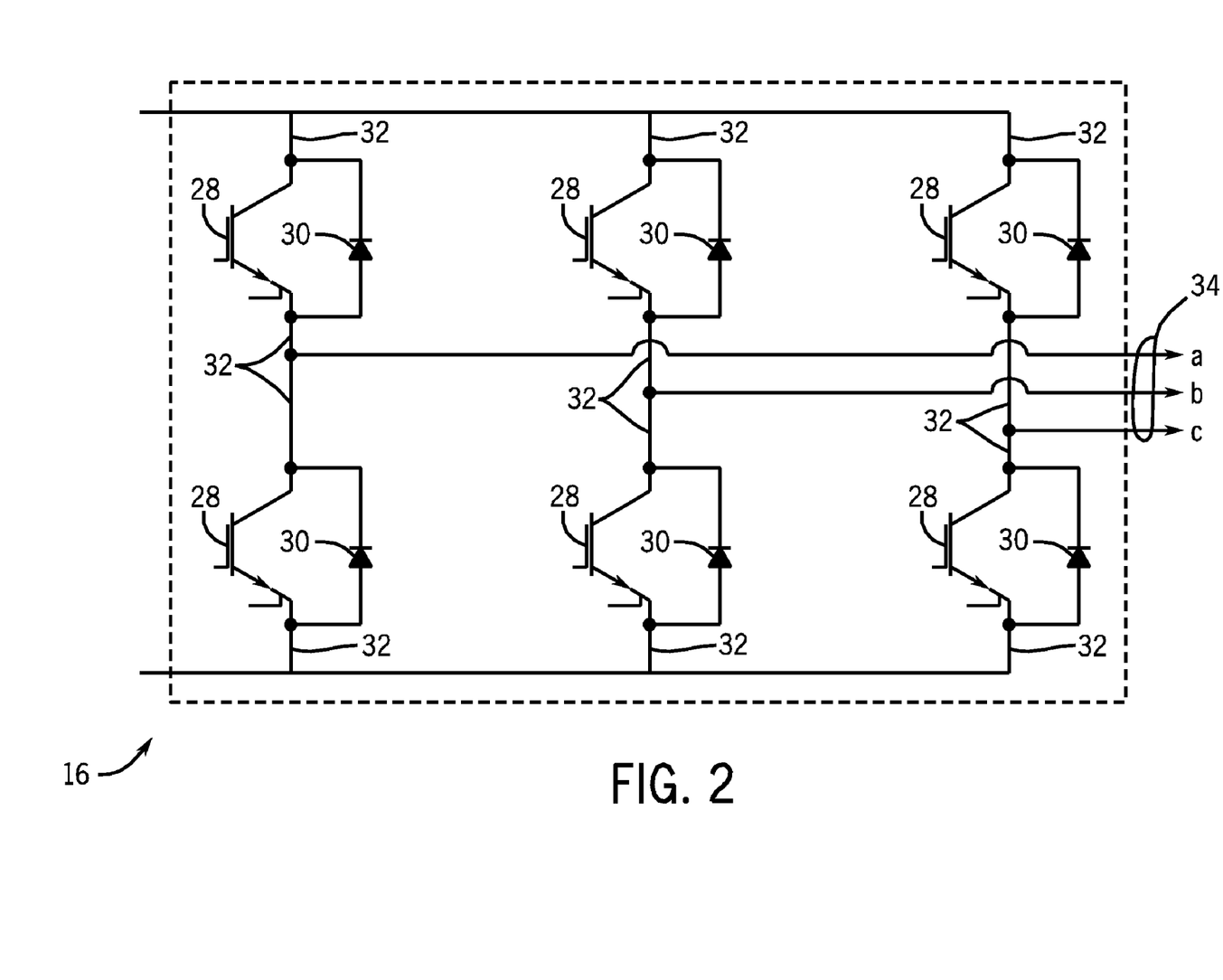
FIG. 2 is a simplified circuit diagram illustrating an inverter module of the motor drive system of FIG. 1.

Referring to FIG. 2, an inverter module 16 may comprise a plurality of insulated gate bipolar transistors (IGBTs) 28 and power diodes 30. The IGBTs 28 and power diodes 30 are joined to positive or negative DC lines (as appropriate) and output lines a, b, or c with bond wires 32. As IGBTs 28 are rapidly switched on and off to produce a discretized three-phase output waveform 34, strain is be placed on bond wires 32 as a result of deformation resulting from stresses of thermal cycling.

Figure 3:
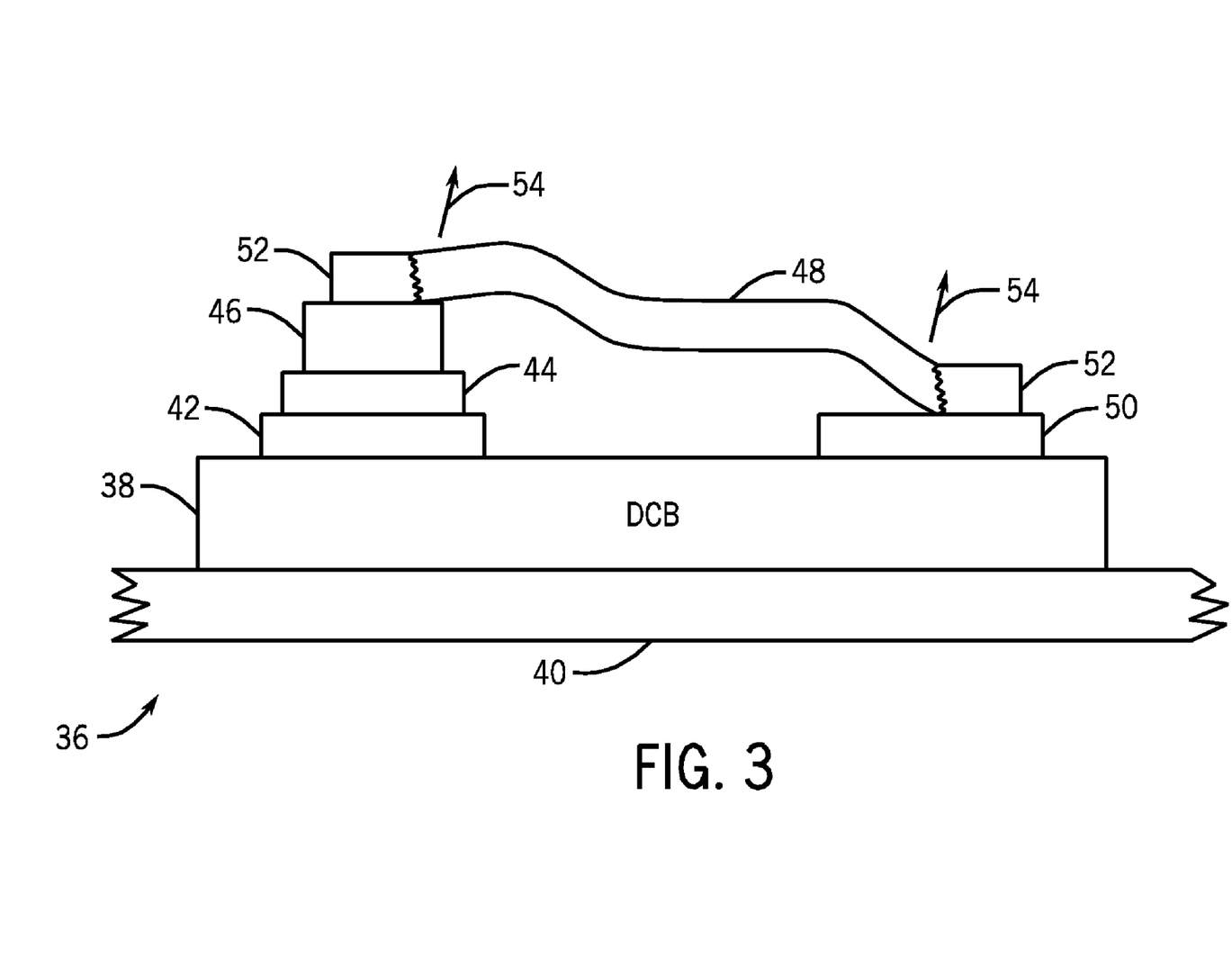
FIG. 3 is a side view of an insulated gate bipolar transistor (IGBT) of the inverter module of FIG. 2, illustrating the failure modes associated therewith.

FIG. 3 illustrates a side view of a solid state switch assembly 36, or IGBT, exhibiting signs of bond wire failure due to cumulative deformation resulting from heat stress. It should be noted that the solid state switch assembly 36 depicted in FIG. 3 and described below represents one exemplary construction of the solid state switch assembly 36, which may be of other construction. As shown in FIG. 3, the solid state switch assembly 36 includes ceramic 38, which rests above a copper substrate 40. Together, ceramic 38 and copper substrates 40, 42 and 50 may form what is known as direct bond copper. Above ceramic 38, copper 42 is joined by solder 44 to a silicon chip 46. Bond wire 48 may be formed of aluminum or other materials, joining silicon chip 46 to copper 50. After numerous power cycles are applied to solid state switch assembly 36, deformation may create heel cracks 52 in bond wire 48. Bond wire 48 may further exhibit lift off 54 as bond wire 48 begins to separate from silicon chip 46 or copper plated with tin 50. When a heel crack 52 or lift off 54 severs bond wire 48 completely, solid state switch assembly 36 fails. Other failure points include any solder interface, including a solder interface beneath copper 40 for joining copper 40 to a baseplate (not shown), solder 44, or one or both ends of the bond wire 48 bond to silicon 46 or copper 50.

Under constant operating conditions, solid state switch assembly 36 may fail in a statistically consistent manner. Accordingly, manufacturers of solid state switch assembly 36 power modules may provide empirical module reliability data. Module reliability data may include, for example, the rate of solid state switch assembly 36 failure at a constant maximum junction temperature ($T_{jMax}$), which may vary with mean junction temperature ($T_m$) or minimum junction temperature ($T_{jMin}$) and junction temperature change ($\Delta T_j$). However, operating conditions in a motor control system 10 may vary dramatically over time, and may depend on the speed of a motor load as well as ambient temperature conditions. Thus, module reliability data may be used to develop a fatigue function, discussed below, which may provide a more accurate estimation of module life.

Accordingly, the integrity of solid state switch assembly 36 in a larger power module, such as inverter module 16, may affect the condition of the inverter module 16. Due to fatigue, breaking of solder bonds, or outright failure of components of solid state switch assembly 36, the inverter module 16 may reach a condition, for example, of degradation, failure, or end of life.

Figure 4:
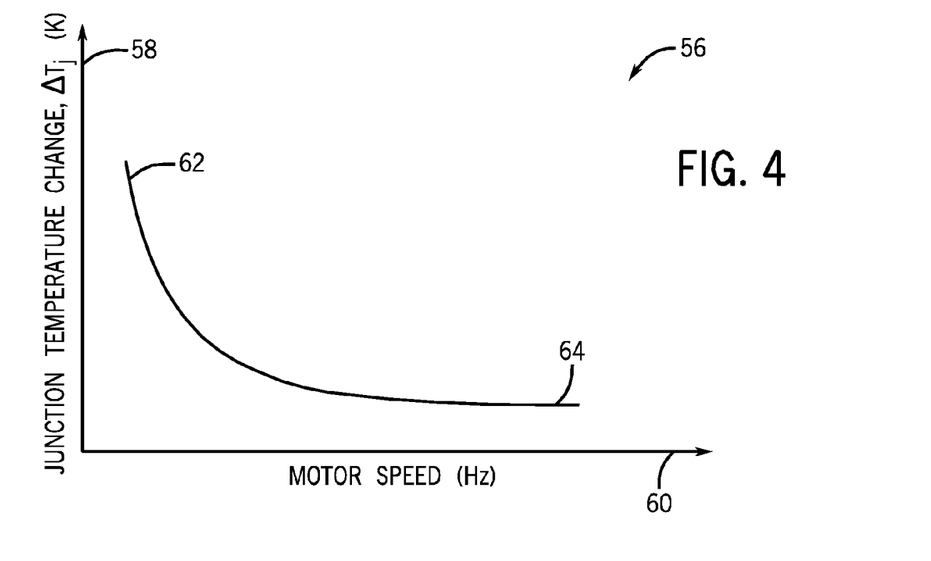
FIG. 4 is a graph illustrating a relationship between junction temperature change ($\Delta T_j$) (K) and motor speed or drive frequency (Hz)
Figure 5:
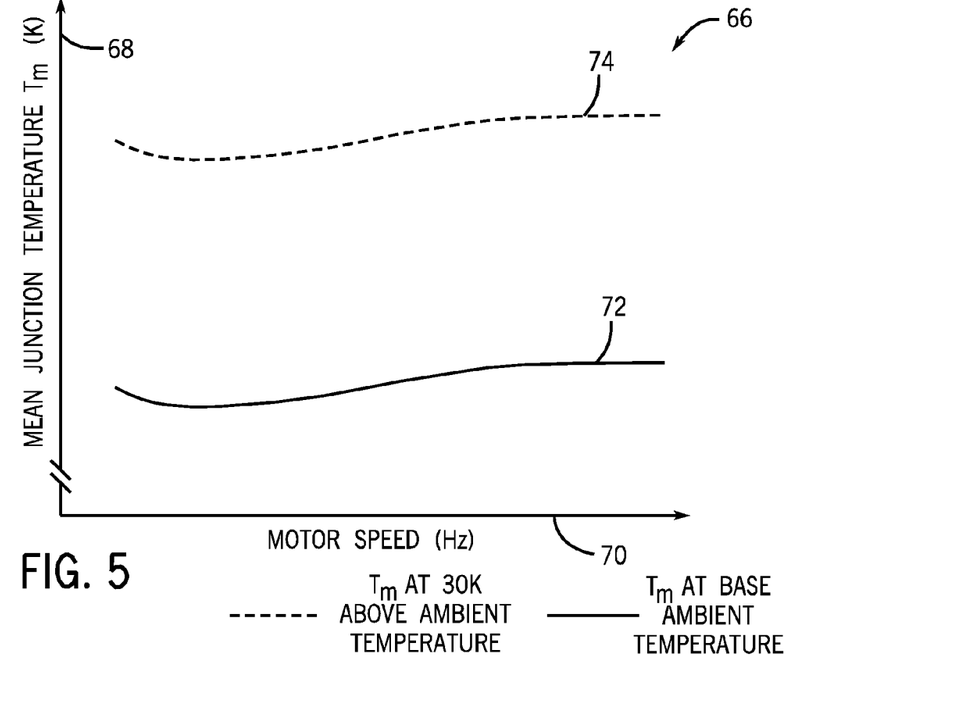
FIG. 5 is a graph illustrating a relationship between mean junction temperature ($T_m$) (K) and motor speed or drive frequency (Hz) at two ambient temperatures 30K apart.

Before turning to FIGS. 4 and 5, FIG. 18 is briefly discussed. In FIG. 18, a plot 230 illustrates a relationship between junction temperature ($T_j$) and time. An ordinate 232 depicts junction temperature ($T_j$) in degrees Celsius and an abscissa 234 depicts time in seconds. As shown in FIG. 18, a given thermal cycle, such as the cycle indicated by numeral 236, includes a maximum junction temperature ($T_{jMax}$) at point 238 and a minimum junction temperature ($T_{jMin}$) at point 240. The difference between points 238 and 240 represent a junction temperature change ($\Delta T_j$) as defined by span 242. A mean junction temperature ($T_m$) is represented by line 244, which may be obtained, for example, by averaging the junction temperature ($T_j$) over time.

FIGS. 4 and 5 illustrate that operating conditions for an inverter module 16 may vary according to motor speed and ambient temperature. Using a variety of well-known methods, control circuitry 22 may determine operating conditions such as maximum junction temperature ($T_{jMax}$), minimum junction temperature ($T_{jMin}$), junction temperature change ($\Delta T_j$), and mean junction temperature ($T_m$). For example, thermal regulator software running on a processor within control circuitry 22 may calculate maximum junction temperature ($T_{jMax}$) using well-known methods based on a thermal network model. Junction temperature change ($\Delta T_j$) may likewise be determined using well-known methods based on temperature feedback data from sensors 26 and/or estimated heat dissipation based on output current, discussed in association with an alternative embodiment below.

Having obtained maximum junction temperature ($T_{jMax}$) and junction temperature change ($\Delta T_j$), minimum junction temperature ($T_{jMin}$) may be calculated by subtracting junction temperature change ($\Delta T_j$) from maximum junction temperature. Finally, mean junction temperature ($T_m$) may be determined by adding the values of maximum junction temperature ($T_{jMax}$) and minimum junction temperature ($T_{jMin}$) and dividing the sum by two.

Turning to FIG. 4, plot 56 represents a relationship between inverter module 16 junction temperature change ($\Delta T_j$) and motor speed. Ordinate 58 represents junction temperature change ($\Delta T_j$) in an inverter module 16, while abscissa 60 represents motor speed for a motor driven by an inverter module 16. As illustrated by point 62, when motor speed is very low, approaching 0 Hz, the junction temperature change ($\Delta T_j$) in inverter module 16 is very high. However, as motor speed increases, the junction temperature change ($\Delta T_j$) in inverter module 16 is considerably lower, as illustrated by point 64. It should be appreciated that the curve shows constant output torque or constant output current. Further, the model is applicable to other regimes.

FIG. 5 depicts a plot 66 representing a relationship between mean junction temperature ($T_m$), motor speed, and ambient temperature. Ordinate 68 represents mean junction temperature ($T_m$) of inverter module 16, while abscissa 70 represents speed of a motor driven by inverter module 16. Curve 72 represents a plot of the mean junction temperature ($T_m$) as motor speed increases and when inverter module 16 has a base ambient temperature. Curve 74, however, represents a mean junction temperature ($T_m$) as motor speed increases when inverter module 16 has an ambient temperature 30 K above the base ambient temperature. As apparent from curves 72 and 74, the mean junction temperature ($T_m$) reaches a maximum when the motor speed is very low or very high, but otherwise remains largely constant. However, curves 72 and 74 reveal that a change in ambient temperature may affect the mean junction temperature of inverter module 16 much more so than motor speed.

As illustrated in FIGS. 4 and 5, operating conditions for inverter module 16 may vary dramatically with motor speed and ambient temperature. As a result, module reliability data based on constant operating conditions may not provide a direct means for estimating when an inverter module 16 may fail.

IGBT 30, like solid state switch assembly 36, may fail due to cumulative strain placed upon bond wires 32. By computing the total strain energy per unit volume absorbed by bond wires 32 prior to failure, a means for estimating when IGBT 30 may likely fail may be obtained. Strain energy per unit volume (SE) may be calculated according to the following equation, where σ represents tensile stress and E represents the elasticity modulus of the weaker material:

$$SE = \frac{0.5 \cdot \sigma^2}{E}. \tag{1}$$

Tensile stress (σ) may be calculated according to equation (2), below. In equation (2), $\Delta T_j$ represents junction temperature change, $\Delta\alpha$ represents the difference in the coefficient of thermal expansion (CTE) between bond wires 32 and solid state switch assembly 36 attachment locations, E represents the elasticity modulus of the weaker material, and c is a constraint factor.

$$\sigma = \Delta T_j \cdot \Delta\alpha \cdot E \cdot c \tag{2}$$

Constraint factor (c) is defined in the equation below, where v represents the Poisson ratio in the elastic range for the weaker material:

$$c = \frac{1}{1-v}. \tag{3}$$

Substituting equation (2) into equation (3) yields the following equation for strain energy per unit volume (SE):

$$SE = 0.5 [\Delta T_j \cdot \Delta\alpha \cdot c]^2 \cdot E \tag{4}$$

When $\Delta\alpha$, E, and c remain constant, total strain energy per unit volume ($SE_{TOT}$) accumulated over N cycles may be defined according to the equation below:

$$SE_{TOT} = \Sigma_{i=1}^{N} SE_i \tag{5}$$

Figure 6:
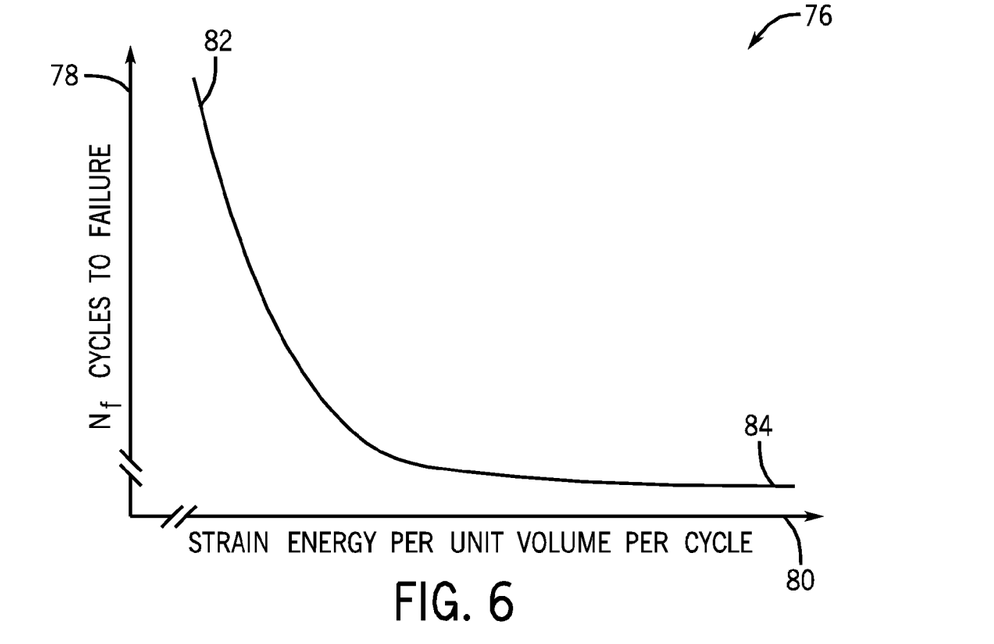
FIG. 6 is a graph illustrating a relationship between total number of cycles to failure, $N_f$, and strain energy per unit volume per cycle.
Figure 7:
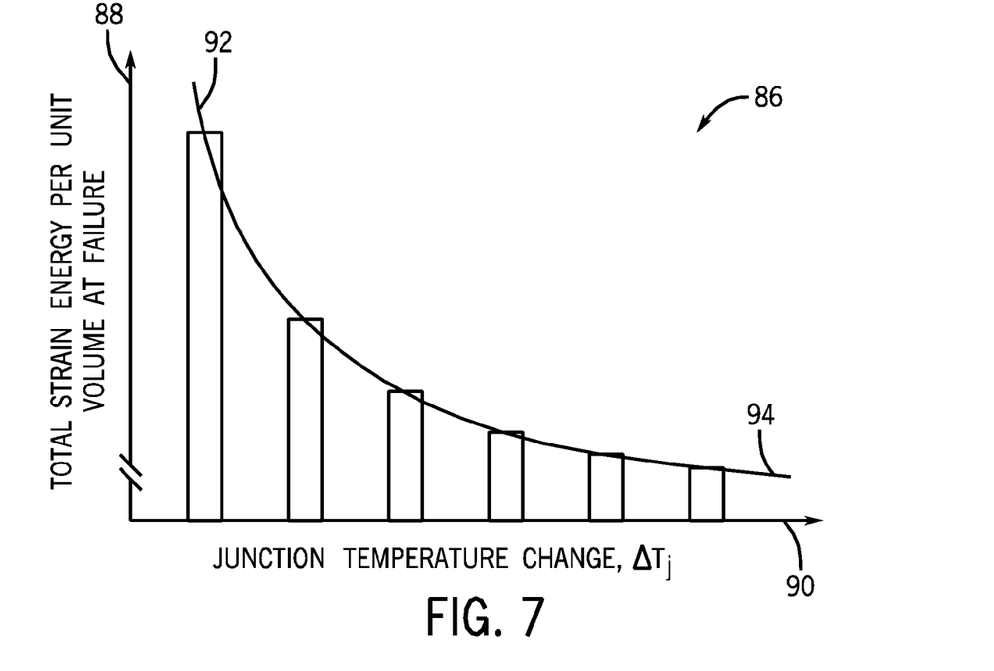
FIG. 7 is a graph illustrating a relationship between total strain energy per unit volume at failure and junction temperature change ($\Delta T_j$)
Figure 8:
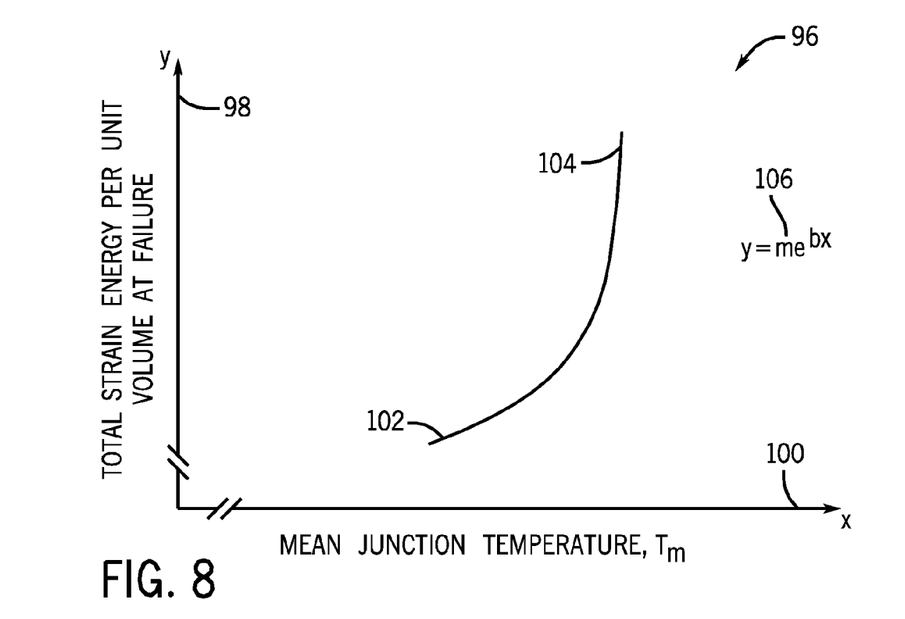
FIG. 8 is a graph illustrating a relationship between total strain energy per unit volume at failure and mean junction temperature ($T_m$) and a corresponding exponential curve equation associated therewith according to an embodiment of the present invention.

Manufacturers may provide module reliability data indicating total number of power cycles before a power module, such as inverter module 16, is likely to fail ($N_f$) at certain constant operating conditions. FIGS. 6-8 represent the results of computing and plotting strain energy per unit volume per cycle ($SE_i$) and total strain energy per unit volume ($SE_{TOT}$) for total number of cycles to failure ($N_f$) for operating conditions including junction temperature change ($\Delta T_j$) and mean junction temperature ($T_m$).

FIG. 6 depicts a plot 76 illustrating the relationship between total number of cycles to failure ($N_f$) and strain energy per unit volume per cycle ($SE_i$). Ordinate 78 represents the total number of cycles to failure ($N_f$) that a power module may endure through before failure. Abscissa 80 represents strain energy per unit volume per cycle ($SE_i$). Plot 76 illustrates that as strain energy per unit volume per cycle ($SE_i$) increases, the total number of cycles accumulated at failure ($N_f$) decreases dramatically. At point 82, strain energy per unit volume per cycle ($SE_i$) is relatively low when the total number of cycles to failure ($N_f$) is relatively high. However, as shown in point 84, as strain energy per unit volume per cycle ($SE_i$) increases, the total number of cycles to failure ($N_f$) is relatively low.

Turning to FIG. 7, a plot 86 represents the relationship between total strain energy per unit volume accumulated by a power module at failure ($SE_{TOT}$) and junction temperature change ($\Delta T_j$) of the power module. Ordinate 88 represents the total strain energy per unit volume accumulated by the power module at failure ($SE_{TOT}$). Total strain energy per unit volume accumulated by the power module at failure ($SE_{TOT}$) may be obtained from equation (5), where N is equal to the total number of cycles to failure ($N_f$) for a given junction temperature change ($\Delta T_j$). Abscissa 90 represents the junction temperature change ($\Delta T_j$). When the junction temperature change ($\Delta T_j$) is relatively low, the total strain energy per unit volume at failure ($SE_{TOT}$) may be relatively high, as illustrated by point 92. However, as junction temperature change increases ($\Delta T_j$), the total strain energy per unit volume at failure ($SE_{TOT}$) may become relatively lower, as illustrated by point 94.

FIG. 8 represents a plot 96 illustrating the relationship between total strain energy per unit volume accumulated by a power module at failure ($SE_{TOT}$) and a mean junction temperature ($T_m$) of the power module. Ordinate 98 represents the total strain energy per unit volume that a power module accumulates at failure ($SE_{TOT}$), and abscissa 100 represents the mean junction temperature ($T_m$). Beginning at point 102, plot 96 of the total strain energy per unit volume at failure ($SE_{TOT}$) increases exponentially with mean junction temperature ($T_m$) to point 104. Fitting to the curve, an exponential curve equation 106 may be obtained, reproduced as equation (6) below, where m and b represent correlation coefficients:

$$y = m \cdot e^{b-x} \tag{6}$$

As illustrated by plot 96 of FIG. 8, total strain energy per unit volume accumulated by a power module at failure ($SE_{TOT}$) depends upon both junction temperature change ($\Delta T_j$) (see FIG. 7) and mean junction temperature ($T_m$). Moreover, Equation (6) represents the curve of plot 96, relating total strain energy per unit volume accumulated at failure ($SE_{TOT}$) to mean junction temperature ($T_m$). When equation (6) is used to normalize equation (5), a fatigue function may be obtained:

$$FF = \sum_{i=1}^{N} \frac{SE_i}{(m \cdot e^{bT_{m_i}})}. \tag{7}$$

The fatigue function (FF) of Equation (7) represents the summation of strain energy per unit volume accumulated during each power cycle ($SE_i$) divided by total strain energy at failure for the mean junction temperature ($T_m$) of each power cycle, as determined by the curve of plot 96. Because the fatigue function (FF) represents the normalization of the summation of strain energy per unit volume accumulated at failure ($SE_{TOT}$), when the fatigue function (FF) approaches 1, the power module is likely to fail. From the equations above, the fatigue function (FF) may be alternatively described by equation (8) below:

$$FF = \sum_{i=1}^{N} \left[ \frac{0.5 \cdot \Delta \alpha^2 \cdot c^2 \cdot E}{m} \right] \cdot \Delta T_{j_i}^2 \cdot e^{-b \cdot T_{m_i}}. \tag{8}$$

Figure 9:
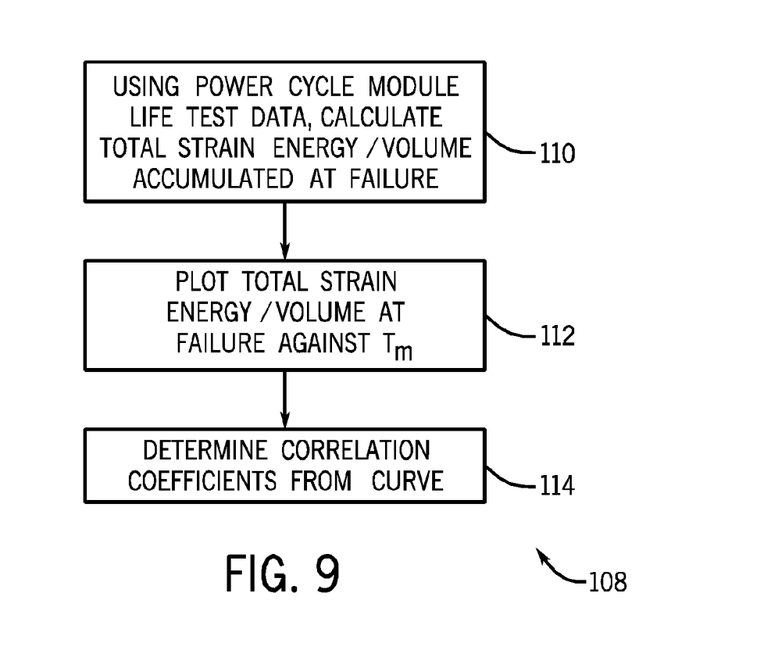
FIG. 9 is a flowchart depicting a method of obtaining reference values for a fatigue function calculation based on manufacturer cycle life data in accordance with an embodiment of the present invention.

FIG. 9 depicts a flow chart 108 describing a method for determining correlation coefficients (b and m) for use in the fatigue function (FF). Block 110 represents a first step, in which empirical power module reliability data may be used to calculate total strain energy per unit volume accumulated at failure ($SE_{TOT}$). Total strain energy per unit volume accumulated at failure ($SE_{TOT}$) may be calculated using equation (5), where N is equal to the total number of cycles to failure ($N_f$) for each given junction temperature change ($\Delta T_j$), as well as for each mean junction temperature ($T_m$). Block 112 represents a second step, in which total strain energy per volume accumulated by a power module at failure ($SE_{TOT}$) is plotted against mean junction temperature ($T_m$). Block 114 represents a final step, in which the plot of block 112 may be analyzed to determine a curve equation (6) in exponential form. Correlation coefficients m and b may be obtained from the curve equation.

Figure 10:
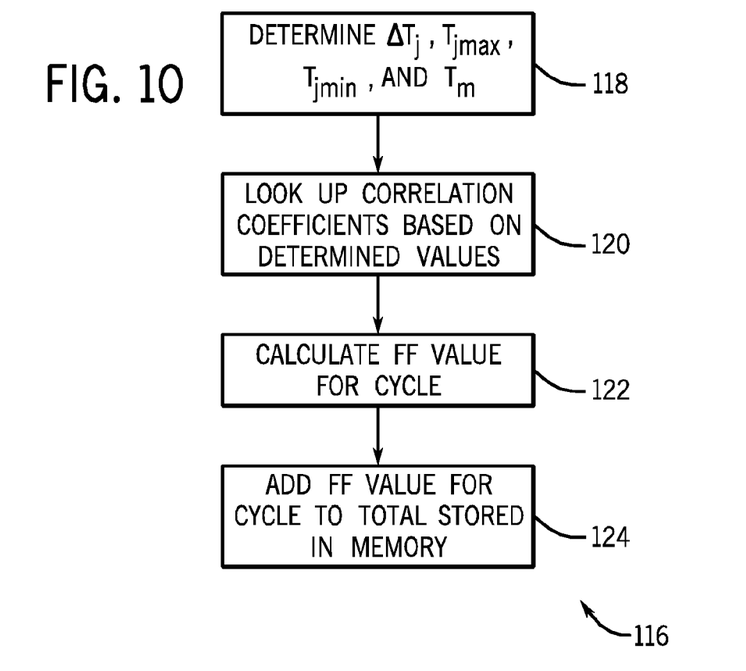
FIG. 10 is a flowchart depicting a method of tracking power module cycle life over variable operating conditions in accordance with an embodiment of the present invention.

FIG. 10 depicts a flow chart 116, which represents a method of estimating when a power module may fail. Block 118 represents a first step, in which the junction temperature change ($\Delta T_j$), the maximum junction temperature ($T_{jMax}$), the minimum junction temperature ($T_{jMin}$), and the mean junction temperature ($T_m$) may be determined by control circuitry 22 in combination with sensors 26 according to methods discussed above. Block 120 represents a second step, in which correlation coefficients m and b are obtained from memory. In a third step, represented by block 122, the fatigue factor (FF) may be calculated for a present power cycle or for a period representing a plurality of power cycles. The fatigue factor (FF) may be calculated according to equations (7) or (8), where N represents the total number of power cycles in the period for calculation. In final block 124, the fatigue factor value for the cycle or the period representing a plurality of cycles is added to a running total stored in the memory. The running total represents the total proportion of power module life expended since the beginning of the operation of the power module.

Figure 11:
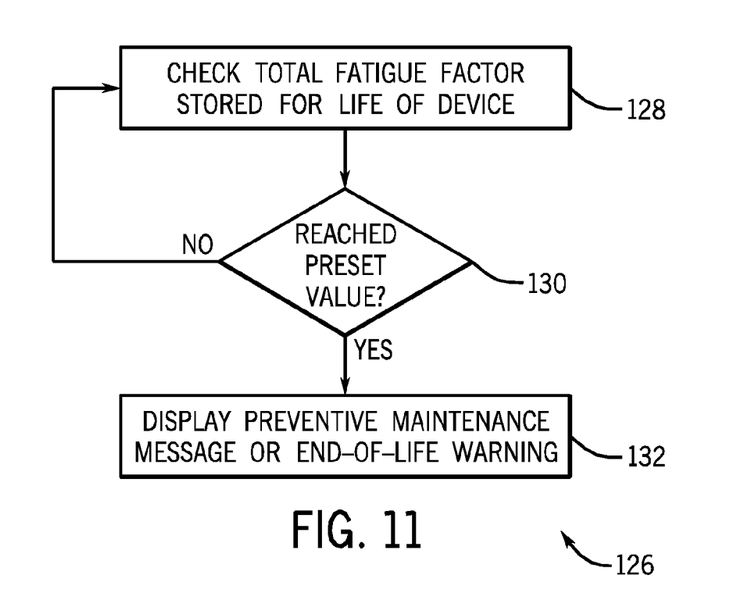
FIG. 11 is a flowchart depicting a method of detecting when a power module cycle life approaches a predetermined level for providing preventive maintenance or an end-of-life warning in accordance with an embodiment of the invention.

Turning to FIG. 11, flowchart 126 represents a method for determining when to display a preventive maintenance message or an end of life warning. Beginning with block 128, which represents a first step, a total fatigue factor (FF) value stored for the life of the device is checked. Because the cumulative fatigue factor (FF) value will approach 1 as the device is about to fail, decision block 130 indicates that if the device has reached a preset value, such as 0.8 or 0.9, the process may flow to a next step represented by block 132. In block 132, a preventive maintenance message or an end of life warning may be indicated by control circuitry 22 or remote control circuitry 24. If a preset value has not been reached in decision block 130, the fatigue factor (FF) value may be checked again later, according generally to the above method.

Figure 12:
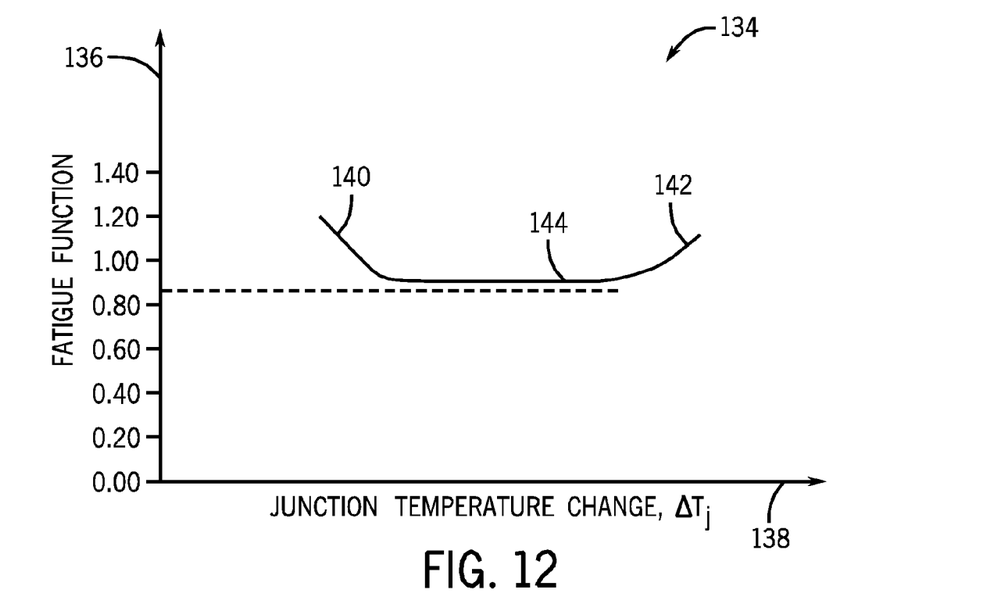
FIG. 12 is a graph illustrating a relationship between cumulative fatigue function values and junction temperature change ($\Delta T_j$)

FIG. 12 depicts a representative plot 134 relating calculated total fatigue function (FF) values to junction temperature change ($\Delta T_j$). Ordinate 136 represents the cumulative fatigue function (FF) value at power module failure. As junction temperature change increases, the fatigue function (FF) remains approximately between values of 1.20 and 0.90. At points 140 and 142, the fatigue function approaches 1.20, while at point 144, the fatigue function approaches 0.90. As indicated by plot 144, the power module tends to fail as the cumulative fatigue function (FF) value approaches 1 across a range of possible values for junction temperature change ($\Delta T_j$). It should be noted that the relationship illustrated in FIG. 12 is exemplary only, and the actual performance of the device may vary, for example, depending on the device manufacturer.

Figure 13:
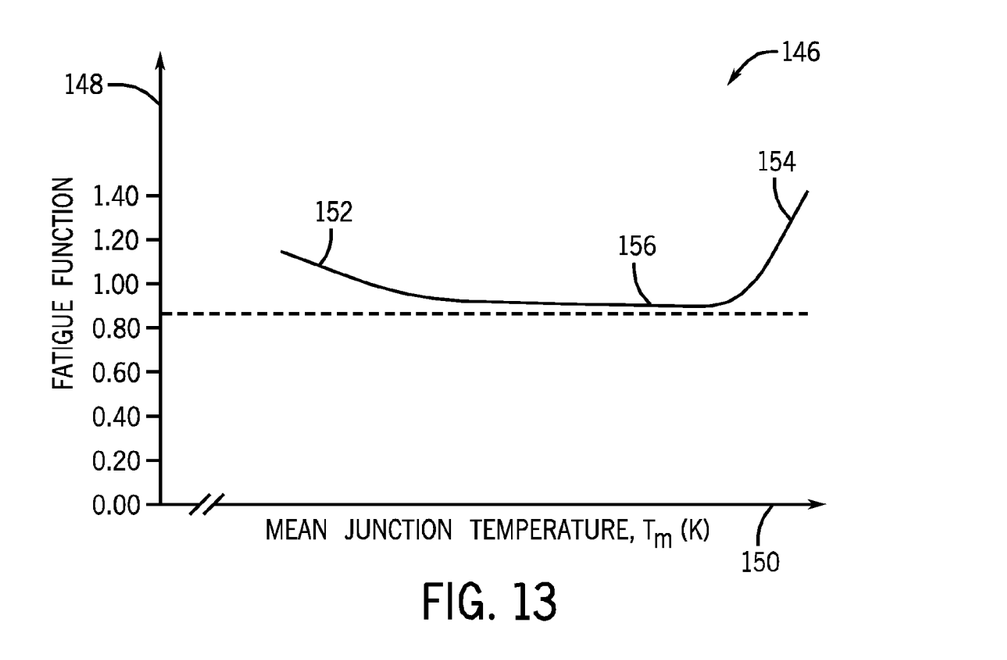
FIG. 13 is a graph illustrating a relationship between cumulative fatigue function values and mean junction temperature ($T_m$)

FIG. 13 represents a plot 146 relating calculated total fatigue function (FF) values to mean junction temperature ($T_m$). Ordinate 148 represents the cumulative fatigue function (FF) value at power module failure. Abscissa 150 represents the mean junction temperature ($T_m$). As the mean junction temperature ($T_m$) increases, the fatigue function cumulative values remain between roughly 1.30 and 0.90. At points 152 and 154, the fatigue function (FF) cumulative values approach 1.10 and 1.30, while at point 156, the fatigue function (FF) cumulative value approaches 0.90. As indicated by plot 156, the power module tends to fail as the cumulative fatigue function (FF) value approaches 1 across a range of possible values for mean junction temperature ($T_m$). Accordingly, the fatigue function (FF) may reasonably estimate when a power module may fail despite wide variations in operating conditions. It should be noted that the relationship illustrated in FIG. 13 is exemplary only, and the actual performance of the device may vary, for example, depending on the device manufacturer.

Figure 14:
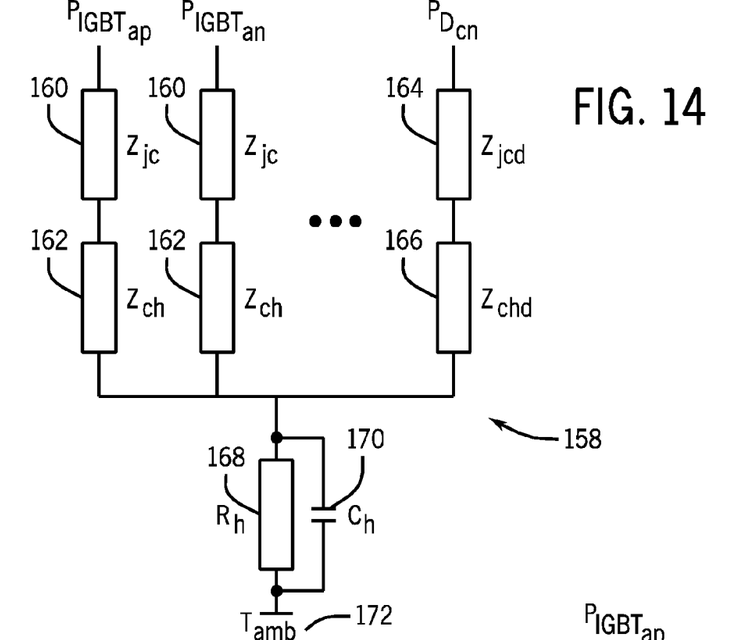
FIG. 14 depicts a thermal network model of the inverter module of FIG. 2.
Figure 15:
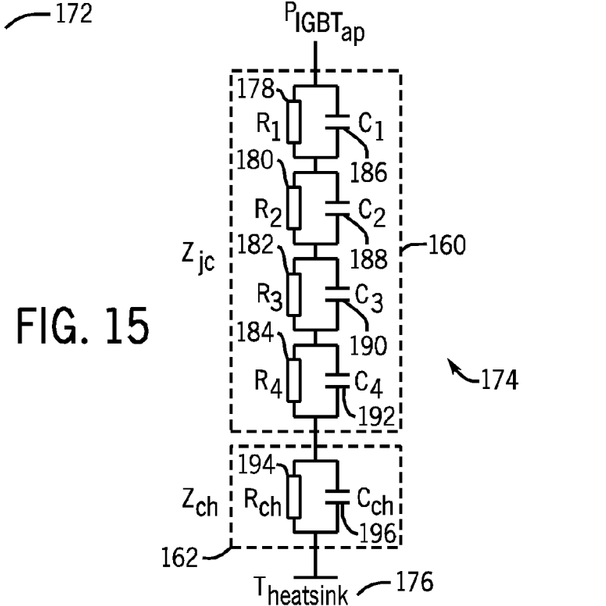
FIG. 15 depicts a thermal network model of an IGBT in the inverter module of FIG. 2.
Figure 16:
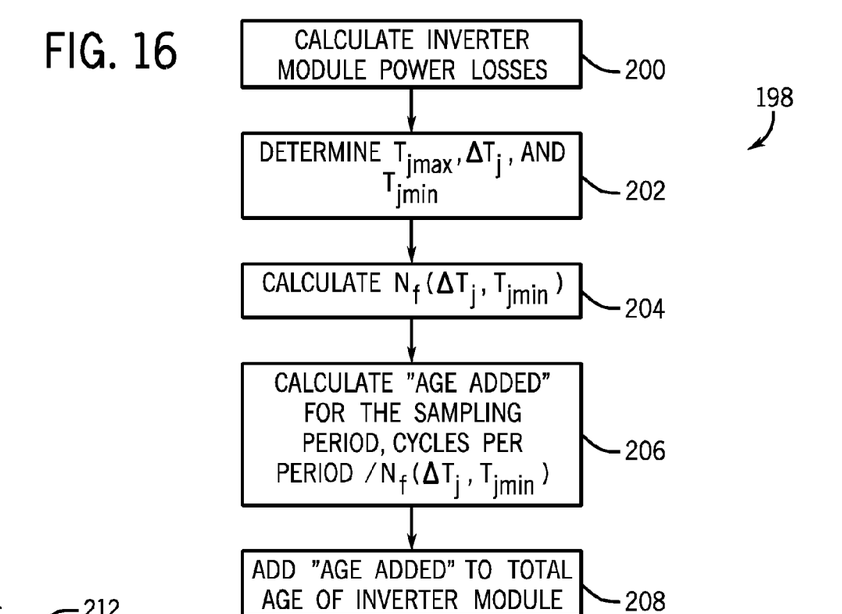
FIG. 16 is a flowchart illustrating another method of predicting when a power module may fail in accordance with an embodiment of the invention.

FIGS. 14-16 represent an alternative embodiment for estimating when a power module may fail. Turning to FIG. 14, a thermal network model 158 of inverter module 16 describes thermal impedance of each component. For simplification, thermal network model 158 illustrates only two of the six IGBTs 28 and one of the six diodes 30 employed by inverter module 16. As illustrated by thermal network model 158, power losses from each IGBT 28 pass through a junction-to-case thermal impedance $Z_{jc}$ 160 and a grease layer thermal impedance $Z_{ch}$ 162. Similarly, power losses from each diode 30 pass through a junction-to-case thermal impedance $Z_{jcd}$ 164 and a grease layer thermal impedance $Z_{chd}$ 166.

Junction-to-case thermal impedances $Z_{jc}$ 160 and $Z_{jcd}$ 164 represent thermal impedance applied as power losses exit each component into a case enclosing inverter module 16. Grease layer thermal impedances $Z_{ch}$ 162 and $Z_{chd}$ 166 represent thermal impedance applied by a thermal grease joining the case of inverter module 16 to a heatsink. In thermal network model 158, the thermal impedance of the heatsink is represented by a thermal resistance 168 and a thermal capacitance 170. The thermal impedance of the heatsink terminates in a low temperature represented by ambient temperature $T_{amb}$ 172.

FIG. 15 illustrates a thermal network model 174 illustrating in greater detail the junction-to-case thermal impedance $Z_{jc}$ 160 and grease layer thermal impedance $Z_{ch}$ 162 in series between the source of power losses for an IGBT 28 to a heatsink 176. Junction-to-case thermal impedance $Z_{jc}$ 160 includes four thermal impedances in series. Each thermal impedance includes a thermal resistance and a thermal capacitance joined in parallel.

Thermal resistances include $R_1$ 178, $R_2$ 180, $R_3$ 182, and $R_4$ 184, and thermal capacitances include $C_1$ 186, $C_2$ 188, $C_3$ 190, and $C_4$ 192, values for which may generally be obtained from a datasheet provided by the manufacturer of inverter module 16. In contrast, grease layer thermal impedance $Z_{ch}$ 162 includes a thermal resistance $R_{ch}$ 194 and a thermal capacitance $C_{ch}$ 196, values for which may be obtained by empirical testing. Temperature variation beneath heatsink 176 may be neglected, since the time constant of the thermal impedance of the heatsink 176 is relatively higher than the time constants for junction-to-case thermal impedance $Z_{jc}$ 160 and grease layer thermal impedance $Z_{ch}$ 162.

To establish a baseline junction temperature ($T_j$), one or more negative temperature coefficient (NTC) sensors may be employed. Using an NTC sensor, the baseline junction temperature ($T_j$) may be determined at a location in the thermal model around the grease layer thermal impedance $Z_{ch}$ 162. Based on the baseline junction temperature ($T_j$) observed, maximum junction temperature ($T_{jMax}$), junction temperature change ($\Delta T_j$), and minimum junction temperature ($T_{jMin}$) using well known techniques associated with the thermal network model.

Referring to FIG. 16, flowchart 198 depicts another embodiment of the present technique for estimating when an inverter module 16 may fail. In first block 200, IGBT 28 power losses (PI(f,$f_s$,$I_{rms}$)) may be calculated in thermal regulator software running on a processor within control circuitry 22, based on a thermal network model. Total power losses for a given IGBT 28 (PI(f,$f_s$,$I_{rms}$)) may approximate the sum of IGBT conduction losses $PI_c$ and IGBT switching losses $PI_s$, as set forth in the following equations:

$$PI_c(f, I_{rms}) = \left(\frac{1}{2\cdot\pi} + \frac{M(f)\cdot PF}{8}\right)\cdot V_t \cdot I_{rms} \cdot \sqrt{2} + \left(\frac{1}{8} + \frac{M(f)\cdot PF}{3\cdot\pi}\right)\cdot R_t \cdot 2 \cdot I_{rms}^2; \quad (9)$$

$$PI_s(f, f_s, I_{rms}) = \frac{1}{\pi}\cdot f_s \cdot E_{onoff} \cdot \left(\frac{\sqrt{2}\cdot I_{rms}}{I_c}\right)\cdot \left(\frac{V_{dc}}{V_{cc}}\right); \quad (10)$$

$$PI(f, f_s, I_{rms}) = PI_c(f, I_{rms}) + PI_s(f, f_s, I_{rms}). \quad (11)$$

In equations (9), (10), and (11) above, f represents inverter module 16 output frequency, $I_{rms}$ represents the RMS current through inverter module 16, $f_s$ represents inverter module switching frequency, and $E_{onoff}$ represents the energy required to switch IGBT 28 on and off. It may be noted that in this example, $E_{onoff}$ represents the total energy to turn on and off the IGBT 28 at the output current and half the rated IGBT 28 bus voltage (600 V for 1200 V rated IGBT). The term $$\left(\frac{V_{dc}}{V_{cc}}\right)$$

effectively operates as a scaling function. Other conditions and relationships may be used to compute these parameters. Additionally, M(f) represents the modulation index and PF represents the power factor of a load driven by inverter module 16. $V_t$ and $R_t$ represent approximate IGBT 28 conduction voltages at small or near zero forward current and slope resistances, which may be obtained from an IGBT 28 manufacturer datasheet. Continuing to view flowchart 198 of FIG. 16, in block 202, maximum junction temperature ($T_{jMax}$), junction temperature change ($\Delta T_j$), and minimum junction temperature ($T_{jMin}$) are determined over a given sample period ($T_s$). To approximate maximum junction temperature ($T_{jMax}$), thermal regulator software running on a processor within control circuitry 22 may use well-known methods based on a thermal network model.

To approximate junction temperature change ($\Delta T_j$), a "boost factor" (BF(f)) may be first approximated according to the following equation:

$$BF(f) = 1 + \sum_{i=1}^{4} \frac{2.14\cdot R_i}{\sqrt{1+(6.28\cdot f \cdot \tau_i)^2}} + \frac{3.14\cdot R_{ch}}{\sqrt{1+(6.28\cdot f \cdot \tau_{ch})^2}}. \quad (12)$$

Total power losses for a given diode (PD(f,$f_s$,$I_{rms}$)) may equal the sum of diode conduction losses $PD_c$ and diode switching losses $PD_s$, as set forth in the following equations:

$$PD_c(f, I_{rms}) = \left(\frac{1}{2\cdot\pi} - \frac{M(f)\cdot PF}{8}\right)\cdot V_d \cdot I_{rms} \cdot \sqrt{2} + \left(\frac{1}{8} - \frac{M(f)\cdot PF}{3\cdot\pi}\right)\cdot R_d \cdot 2 \cdot I_{rms}^2; \quad (13)$$

$$PD_s(f, f_s, I_{rms}) = \frac{1}{\pi}\cdot f_s \cdot E_{rec} \cdot \left(\frac{\sqrt{2}\cdot I_{rms}}{I_c}\right)\cdot \left(\frac{V_{dc}}{V_{cc}}\right); \quad (14)$$

$$PD(f, f_s, I_{rms}) = PD_c(f, I_{rms}) + PD_s(f, f_s, I_{rms}). \quad (15)$$

In equations (13), (14), and (15) above, $E_{rec}$ represents the energy required to switch diode on and off. The variables $V_d$ and $R_d$ represent approximate diode forward voltage drop at around zero current and slope resistances.

For a majority of the drive, the mean junction temperature ($T_m$) can be calculated using an NTC sensor. Generally, the NTC temperature sensor is embedded inside or on the heatsink near the IGBT module. Under this condition, the average junction temperature of the IGBT can generally approximately by the following equations:

$$T_m = T_{ntc} + PI \cdot \sum_{i=1}^{4} \frac{R_i}{1+sR_iC_i} + PI\frac{R_{ii}}{1+sR_{ii}C_{ii}} + PD\frac{R_{di}}{1+sR_{di}C_{di}}, \quad (16)$$

where, Ri and Ci represent the thermal resistance and capacitance, respectively, as shown in FIG. 15. The variables Rii and Cii represent thermal couple resistance and thermal couple capacitance, respectively, between IGBT power and temperature difference between the IGBT case layer and NTC. The variables Rdi and Cdi represent the thermal couple resistance and the thermal couple capacitance, respectively, between diode power and temperature difference between the IGBT case layer and NTC. The variable $T_{ntc}$ represents the temperature of the drive as measured by the NTC sensor. The variables Rii, Cii, Rdi, and Cdi may be extracted parameters from the drive.

To approximate the maximum junction temperature of the IGBT, equations (16) and (12) in the original disclosure may be combined as:

$$T_{jmax} = T_m + PI \cdot [BF(f)-1] \quad (17).$$

Before applying the boost factor (BF(f)) value to obtain junction temperature change ($\Delta T_j$), an interim value BF_$\Delta T_j$ may be approximated according to the following equations:

$$BF\_\Delta T_j(f) = 1.85 \cdot (BF(f)-1) \text{ if } BF(f) < 2 \quad (18);$$

$$BF\_\Delta T_j(f) = BF(f) \text{ if } BF(f) \geq 22 \quad (19).$$

The interim value BF $\Delta T_j$ may be subsequently applied to obtain junction temperature change ($\Delta T_j$), as set forth in the equation below, where $R_{jc}$ represents junction-to-case thermal resistance:

$$\Delta T_j(f, f_s, I_{rms}) = R_{jc} \cdot PI(f, f_s, I_{rms}) \cdot BF\_\Delta T_j(f) \quad (20).$$

With maximum junction temperature ($T_{jMax}$) and junction temperature change ($\Delta T_j$), minimum junction temperature ($T_{jMin}$) may be approximated by subtracting junction temperature change ($\Delta T_j$) from maximum junction temperature ($T_{jMax}$):

$$\Delta T_{jMin}(f, f_s, I_{rms}) = T_{jMax}(f, f_s, I_{rms}) - \Delta T_j(f, f_s, I_{rms}) \quad (21).$$

As indicated by block 204 of flowchart 198 of FIG. 16, a total number of cycles to failure ($N_f$), dependent upon junction temperature change ($\Delta T_j$) and minimum junction temperature ($T_{jMin}$) and based on empirical module reliability data, may be subsequently approximated. Total number of cycles to failure ($N_f$) may be approximated based on total strain energy per unit volume ($SE_{TOT}$), as described above, but may also be approximated according to equations (25) and (26) below.

Block 206 of flowchart 198 represents a step calculating a total amount of "age added" to inverter module 16 during the sampling period $T_s$. A total amount of "age added" in the sampling period may be obtained according to the equations below:

$$\text{Age\_added} = \frac{\text{cycles\_per\_period}}{N_f(\Delta T_j, T_{jMin})}; \quad (22)$$

$$\text{cycles\_per\_period} = T_s \cdot f. \quad (23)$$

As indicated by block 208 of flowchart 198 of FIG. 16, a total age of inverter module 16 may subsequently be approximated by adding "age added" to the total age calculated prior to the most recent sample period, as described by the equation below:

$$\text{Total\_age} = \text{Total\_age}_{prior} + \text{Age\_added} \quad (24).$$

As with the fatigue factor (FF) described above, when the value of total age approaches 1, inverter module 16 is likely to fail.

Figure 17:
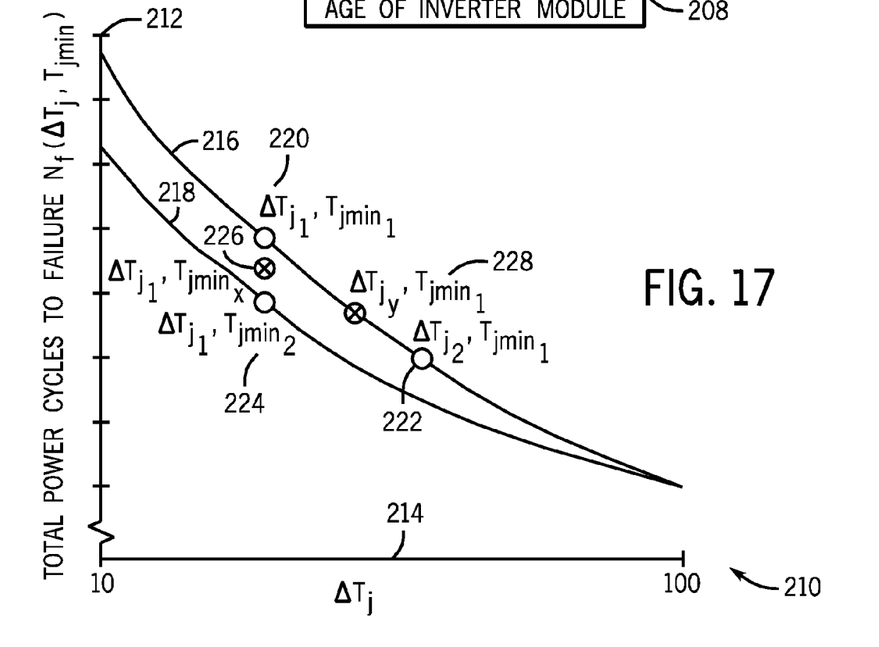
FIG. 17 is a plot illustrating total number of cycles to failure for an IGBT of the inverter module of FIG. 2 at certain constant values of minimum junction temperature and junction temperature change.

FIG. 17 depicts a logarithmic plot 210 of total power cycles to failure ($N_f$) for an IGBT 28 at values of junction temperature change ($\Delta T_j$) and minimum junction temperature ($T_{jMin}$) based upon empirical data. Ordinate 212 represents the total power cycles to failure ($N_f$) on a logarithmic scale, and abscissa 214 represents junction temperature change ($\Delta T_j$) on a logarithmic scale. Curves 216 and 218 depict total power cycles to failure ($N_f$) as junction temperature change ($\Delta T_j$) increases at a constant minimum junction temperature ($T_{jMin}$) of $T_{jMin1}$, and $T_{jMin2}$, respectively.

An interpolated value $N_f(\Delta T_{jx}, T_{jMinx})$ 226 may be obtained using data points $N_f(\Delta T_{j1}, T_{jMin1})$ 220 and $N_f(\Delta T_{j1}, T_{jMin2})$ 224 in conjunction with the following equation:

$$N_f(\Delta T_{jx}, T_{jMinx}) = \quad (25)$$

$$N_f(\Delta T_{j1}, T_{jMin1}) \cdot \left(\frac{N_f(\Delta T_{j1}, T_{jMin2})}{N_f(\Delta T_{j1}, T_{jMin1})}\right)^{\frac{T_{jMin2} - T_{jMin1}}{T_{jMin2} - T_{jMin1}}}.$$

Alternatively, an interpolated value $N_f(\Delta T_{jy}, T_{jMin1})$ 226 may be obtained using data points $N_f(\Delta T_{j1}, T_{jMin1})$ 220 and $N_f(\Delta T_{j2}, T_{jMin1})$ 222 in conjunction with the following equation:

$$N_f(\Delta T_{jy}, T_{jMin1}) = \quad (26)$$

$$N_f(\Delta T_{j1}, T_{jMin1}) \cdot \left(\frac{N_f(\Delta T_{j2}, T_{jMin1})}{N_f(\Delta T_{j1}, T_{jMin1})}\right)^{\frac{\Delta T_{jy} - \Delta T_{j1}}{\Delta T_{j2} - \Delta T_{j1}}}.$$

Thus, using equations (20) and (21), an interpolated value representing total power cycles to failure ($N_f$) for an IGBT 28 at values of junction temperature change ($\Delta T_j$) and minimum junction temperature ($T_{jMin}$) may be obtained.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:
1. A method of analyzing a power module comprising:
determining a total strain energy per unit volume of an electrical conductor accumulated over a predetermined number of cycles to failure at a plurality of mean junction temperatures and junction temperature changes;

determining a failure parameter of the electrical conductor, based on the total strain energy; and estimating using a processor a power module condition based on one or more of the total strain energy per unit volume of the electrical conductor and the failure parameter at a plurality of mean junction temperatures and junction temperature changes.

2. The method of claim 1, wherein determining the total strain energy per unit volume of the electrical conductor accumulated over the predetermined total number of cycles to failure at the plurality of mean junction temperatures and junction temperature changes comprises plotting the total strain energy per unit volume of the electrical conductor at failure against the plurality of mean junction temperatures.

3. The method of claim 2, wherein plotting the total strain energy per unit volume of the electrical conductor at failure against the plurality of mean junction temperatures comprises fitting a curve to a plot of the total strain energy per unit volume of the electrical conductor at failure against mean junction temperatures to obtain correlation coefficients relating total strain energy per unit volume of the electrical conductor at failure and mean junction temperatures in a continuous manner.

4. The method of claim 1, wherein determining the failure parameter comprises summing an amount of strain energy per unit volume of the electrical conductor accumulated in a cycle divided by the total strain energy per unit volume of the electrical conductor accumulated over the predetermined number of cycles to failure for a mean temperature and temperature rise associated with the cycle for all cycles.

5. The method of claim 4, wherein estimating the condition of the power module comprises estimating that the power module will fail when a summed total amount of strain energy per unit volume of the electrical conductor accumulated in the cycle divided by the total strain energy per of the electrical conductor volume accumulated over the predetermined number of cycles to failure at the mean temperature and temperature rise associated with the cycle for all cycles approaches unity.

6. A method of operating a motor controller comprising:
driving a motor using an inverter module having a power module;
determining a mean junction temperature and junction temperature change associated with a cycle;
calculating total strain energy per unit volume of an electrical conductor accumulated by at least one solid state switch assembly of the power module during the cycle; and
estimating a condition of the at least one power module based on total strain energy per unit volume of the electrical conductor accumulated by the at least one solid state switch assembly of the power module during each cycle and the mean junction temperature and junction temperature change associated with each cycle.

7. The method of claim 6, wherein estimating the condition of the power module comprises calculating the total strain energy per unit volume of the electrical conductor accumulated during each cycle divided by a total strain energy per unit volume of the electrical conductor a solid state switch assembly of a power module generally would have accumulated at failure when operating at the mean junction temperature and junction temperature change associated with each cycle.

8. The method of claim 7, wherein estimating the condition of the power module comprises summing over all prior cycles the total strain energy per unit volume of the electrical conductor accumulated during each cycle divided by a total strain energy per unit volume of the electrical conductor a solid state switch assembly of a power module generally would have accumulated at failure when operating at the mean junction temperature and junction temperature change associated with each cycle.

9. The method of claim 6, wherein estimating the condition of the power module comprises calculating a proportion of total power module life expended in each cycle based on total strain energy per unit volume of the electrical conductor accumulated by the at least one solid state switch assembly of the power module each cycle and the mean junction temperature and junction temperature change associated with each cycle.

10. The method of claim 9, wherein estimating the condition of the power module comprises adding the proportion of total power module life expended in each cycle to a running total, such that the running total represents a total proportion of power module life expended from a start of an operational life of the motor controller.

11. A motor control system comprising:
an inverter module having a power module, the inverter module being configured to provide power to a motor;
control circuitry configured to control the inverter module;
junction temperature change determination circuitry configured to determine a junction temperature change associated with at least one solid state switch assembly of the power module;
mean junction temperature determination circuitry configured to determine a mean junction temperature associated with the at least one solid state switch assembly of the power module;
strain energy per unit volume of an electrical conductor accumulation determination circuitry configured to determine a total amount of strain energy per unit volume of the electrical conductor accumulated by the at least one solid state switch assembly of the power module each cycle; and
power module fatigue determination circuitry configured to determine a fraction of power module life expended each cycle based on the total amount of strain energy per unit volume of the electrical conductor accumulated by the at least one solid state switch assembly of the power module each cycle and the junction temperature change associated with the at least one solid state switch assembly of the power module and the mean junction temperature associated with the at least one solid state switch assembly of the power module.

12. The motor control system of claim 11, wherein the power module fatigue determination circuitry is configured to determine the fraction of power module life expended each cycle according to the following equation:

$$FF = \sum_{i=1}^{N} \left[ \frac{0.5 \cdot \Delta\alpha^2 \cdot c^2 \cdot E}{m} \right] \cdot \Delta T_{j_i}^2 \cdot e^{-b \cdot T_{m_i}}.$$

13. The motor control system of claim 11, comprising power module failure estimation circuitry configured to estimate when the at least one solid state switch assembly of the power module will fail based on a summation of each fraction of power module life expended each cycle, such that the at least one solid state switch assembly of the power module will be estimated to fail when the summation approaches one.

14. The motor control system of claim 13, comprising diagnostic circuitry configured to provide an estimated remaining power module life based on the summation of each fraction of power module life expended each cycle.

15. The motor control system of claim 14, wherein the diagnostic circuitry comprises a dashboard gage of remaining power module life.

16. The motor control system of claim 14, wherein the diagnostic circuitry comprises an internal counter configured to initiate preventive maintenance warnings when the summation of each fraction of power module life expended each cycle approaches one.

17. The motor control system of claim 11, wherein the junction temperature change determination circuitry comprises a processor configured to run thermal regulator software for determining the junction temperature change associated with the at least solid state switch assembly of the one power module.

18. The motor control system of claim 11, wherein the control circuitry, the junction temperature change determination circuitry, the mean junction temperature determination circuitry, the strain energy per unit volume of the electrical conductor accumulation determination circuitry, the power module fatigue determination circuitry, or any combination thereof, comprise one or more processors.

* * * * *